(12) United States Patent
Hwang et al.

(10) Patent No.: US 8,482,447 B2
(45) Date of Patent: Jul. 9, 2013

(54) ANALOG-TO-DIGITAL CONVERTER AND DEVICES INCLUDING THE SAME

(75) Inventors: Chi Ho Hwang, Seoul (KR); Yu Jin Park, Seoul (KR); Yong Lim, Hwaseong-si (KR); Han Yang, Seoul (KR)

(73) Assignee: Samsung Electronics Co., Ltd., Suwon-Si, Gyeonggi-Do (KR)

( * ) Notice: Subject to any disclaimer, the term of this patent is extended or adjusted under 35 U.S.C. 154(b) by 112 days.

(21) Appl. No.: 13/116,551

(22) Filed: May 26, 2011

(65) Prior Publication Data

US 2011/0292261 A1 Dec. 1, 2011

(30) Foreign Application Priority Data

May 26, 2010 (KR) ........................ 10-2010-0048960

(51) Int. Cl.
*H03M 1/56* (2006.01)
(52) U.S. Cl.
USPC ........... 341/169; 341/155; 341/164; 341/165; 341/170
(58) Field of Classification Search
USPC .................. 341/156, 164, 165, 169, 170, 155
See application file for complete search history.

(56) References Cited

U.S. PATENT DOCUMENTS

| | | | |
|---|---|---|---|
| 5,920,274 A * | 7/1999 | Gowda et al. .................. | 341/155 |
| 6,545,624 B2 * | 4/2003 | Lee et al. ....................... | 341/155 |
| 6,670,904 B1 * | 12/2003 | Yakovlev ....................... | 341/167 |
| 7,148,831 B2 * | 12/2006 | Krymski ........................ | 341/155 |
| 7,397,011 B2 * | 7/2008 | Berdelle-Hilge ............. | 209/584 |
| 7,554,479 B2 * | 6/2009 | Lim ............................... | 341/169 |
| 7,683,818 B2 * | 3/2010 | Muramatsu et al. .......... | 341/164 |
| 7,804,438 B2 * | 9/2010 | Krymski ........................ | 341/167 |
| 7,924,207 B2 * | 4/2011 | Snoeij et al. .................. | 341/169 |
| 8,269,872 B2 * | 9/2012 | Okumura ....................... | 348/308 |
| 2009/0273500 A1 * | 11/2009 | Krymski ........................ | 341/155 |
| 2011/0114827 A1 * | 5/2011 | Yamaoka et al. ......... | 250/214 R |

* cited by examiner

*Primary Examiner* — Linh Nguyen
(74) *Attorney, Agent, or Firm* — F. Chau & Associates, LLC

(57) ABSTRACT

An analog-to-digital converter including a comparator configured to compare a pixel signal received at a first input terminal of the comparator with a ramp signal received at a second input terminal of the comparator and generate a comparison signal as a result of the comparison; and a ramp signal supply circuit configured to provide the ramp signal to the comparator, wherein the ramp signal supply circuit generates a first signal as part of the ramp signal in response to the comparison signal and a first clock signal being received at the ramp signal supply circuit, wherein a slope of the first signal sequentially changes until the comparison signal makes a transition from one logic level to another and, after the transition, the ramp signal supply circuit generates a second signal as part of the ramp signal, wherein a slope of the second signal sequentially changes, wherein the slope of the second signal is opposite the slope of the first signal.

18 Claims, 8 Drawing Sheets

ANALOG-TO-DIGITAL CONVERTER AND DEVICES INCLUDING THE SAME

CROSS-REFERENCE TO RELATED APPLICATION

This application claims priority under 35 U.S.C. §119 to Korean Patent Application No. 10-2010-0048960 filed on May 26, 2010, the disclosure of which is incorporated by reference herein in its entirety.

BACKGROUND

1. Technical Field

The present invention relates to analog-to-digital conversion technology, and more particularly, to an analog-to-digital converter that performs analog-to-digital conversion by superposing a coarse ramp signal and a fine ramp signal using a plurality of capacitors and devices including the analog-to-digital converter.

2. Discussion of the Related Art

Image pickup devices, such as digital cameras, include semiconductor devices that convert an optical image into an electrical signal. For example, such image pickup devices may use a charge coupled device (CCD) image sensor or a complementary metal-oxide-semiconductor (CMOS) image sensor.

A CMOS image sensor is less expensive to manufacture than a CCD image sensor because the CMOS image sensor is produced by a standard CMOS process. A CMOS image sensor offers more integration than a CCD image sensor because an analog-to-digital converter can be integrated with the CMOS image sensor on a single chip. In addition, the CMOS image sensor uses less power than a CCD image sensor, and thus, the CMOS image sensor is widely used in low power consuming portable devices, such as mobile phones and digital cameras. However, unlike the CCD image sensor, the CMOS image sensor uses a high-resolution analog-to-digital converter which converts an analog signal output from an active pixel sensor (APS) into a digital signal. However, the high-resolution analog-to-digital converter may have a gain error that impacts the performance of the CMOS image sensor.

SUMMARY

Exemplary embodiments of the present inventive concept provide an analog-to-digital converter that performs analog-to-digital conversion by superposing a coarse ramp signal and a fine ramp signal using a plurality of capacitors and devices including the analog-to-digital converter.

According to an exemplary embodiment of the present inventive concept, there is provided an analog-to-digital converter including a comparator configured to compare a pixel signal received at a first input terminal of the comparator with a ramp signal received at a second input terminal of the comparator and generate a comparison signal as a result of the comparison; and a ramp signal supply circuit configured to provide the ramp signal to the comparator, wherein the ramp signal supply circuit generates a first signal as part of the ramp signal in response to the comparison signal and a first clock signal being received at the ramp signal supply circuit, wherein a slope of the first signal sequentially changes until the comparison signal makes a transition from one logic level to another and, after the transition, the ramp signal supply circuit generates a second signal as part of the ramp signal, wherein a slope of the second signal sequentially changes, wherein the slope of the second signal is opposite the slope of the first signal.

The first signal may be provided to the second input terminal via a first capacitor in the ramp signal supply circuit and the second signal may be provided to the second input terminal via a second capacitor in the ramp signal supply circuit. The first capacitor and the second capacitor may have the same capacitance. A voltage of the second signal may sequentially increase in response to a second clock signal having a frequency higher than a frequency of the first clock signal.

The ramp signal supply circuit may include a resistor string configured to divide a power supply voltage to generate a plurality of voltages, a first current source connected between the resistor string and a ground, a resistor connected between a power supply and an output terminal from which the second signal is output, and a second current source connected between the resistor and the ground. As a current of the second current source sequentially decreases in response to a second clock signal, the slope of the second signal may sequentially increase.

The ramp signal supply circuit may further include a mask circuit configured to output the first clock signal or a direct current (DC) voltage in response to the comparison signal and the first clock signal being received at the mask and a switch circuit configured to sequentially change the plurality of voltages in response to the first clock signal received from the mask circuit and output the sequentially changed voltages as the first signal.

The switch circuit may include a plurality of shift registers connected in series to each other to sequentially shift their initial bits in response to the first clock signal; and a plurality of switches configured to sequentially provide the plurality of voltages to the second input terminal in response to the initial bits, respectively, of the shift registers. Differences between adjacent voltages among the plurality of voltages may be the same.

According to an exemplary embodiment of the present inventive concept, there is provided an image processing device including an analog-to-digital converter and a pixel array configured to output a pixel signal. The analog-to-digital converter may include: a comparator configured to compare the pixel signal received at a first input terminal of the comparator with a ramp signal received at a second input terminal of the comparator and generate a comparison signal as a result of the comparison; and a ramp signal supply circuit configured to provide the ramp signal to the comparator, wherein the ramp signal supply circuit generates a first signal as part of the ramp signal in response to the comparison signal and a first clock signal being received at the ramp signal supply circuit, wherein a slope of the first signal sequentially changes until the comparison signal makes a transition from one logic level to another and, after the transition, the ramp signal supply circuit generates a second signal as part of the ramp signal, wherein a slope of the second signal sequentially changes, wherein the slope of the second signal is opposite the slope of the first signal.

The first signal may be provided via a first capacitor connected to the second input terminal and the second signal may be provided via a second capacitor connected to the second input terminal.

A voltage of the second signal may sequentially increase in response to a second clock signal having a frequency higher than a frequency of the first clock signal. A voltage of the first signal may sequentially decrease before the voltage of the second signal is sequentially increased.

The analog-to-digital converter may include a resistor string configured to evenly divide a power supply voltage to generate a plurality of voltages, a first current source connected between the resistor string and a ground, a resistor connected between a power supply and an output terminal from which the second signal is output, and a second current source connected between the resistor and the ground.

As a current of the second current source sequentially decreases in response to a second clock signal, the slope of the second signal may sequentially increase.

The analog-to-digital converter may further include: a mask circuit configured to output the first clock signal or a DC voltage in response to the comparison signal and the first clock signal being received at the mask; and a switch circuit configured to sequentially change the plurality of voltages in response to the first clock signal received from the mask circuit and output the sequentially changed voltages as the first signal.

The image processing device may further include a processor configured to control an operation of the image processing device.

According to an exemplary embodiment of the inventive concept, a comparator configured to compare a pixel signal received at a first input terminal thereof with a ramp signal received at a second input terminal thereof and generate a comparison signal as a result of the comparison; and a ramp signal supply circuit configured to provide the ramp signal to the comparator, wherein the ramp signal is a superposition of a fine signal and a coarse signal generated by the ramp signal supply circuit during a coarse analog-to-digital conversion and a fine analog-to-digital conversion, wherein during the coarse analog-to-digital conversion, a voltage level of the coarse signal sequentially decreases and a voltage level of the fine signal is steady, wherein the voltage level of the coarse signal sequentially decreases until a logic level of the comparison signal is first changed, and then, the voltage level of the coarse signal is steady, and wherein during the fine analog-to-digital conversion, the voltage level of the coarse signal is steady and the voltage level of the fine signal increases.

The fine signal may be kept steady by a first capacitor of the ramp signal supply circuit and the coarse signal may be kept steady by a second capacitor of the ramp signal supply circuit.

The logic level of the comparison signal is first changed in the coarse analog-to-digital conversion when a voltage level of the ramp signal is less than a voltage level of the pixel signal and the logic level of the comparison signal is second changed in the fine analog-to-digital conversion when the voltage level of the ramp signal is greater than the voltage level of the pixel signal.

BRIEF DESCRIPTION OF THE DRAWINGS

The above and other features of the present inventive concept will become more apparent by describing in detail exemplary embodiments thereof with reference to the accompanying drawings in which.

DETAILED DESCRIPTION OF THE EMBODIMENTS

Exemplary embodiments of the present inventive concept will be described more fully hereinafter with reference to the accompanying drawings. This inventive concept may, however, be embodied in many different forms and should not be construed as limited to the embodiments set forth herein. Like reference numbers may refer to like elements throughout the drawings and the following description.

It will be understood that when an element is referred to as being "connected" or "coupled" to another element, it can be directly connected or coupled to the other element or intervening elements may be present.

Figure 1:
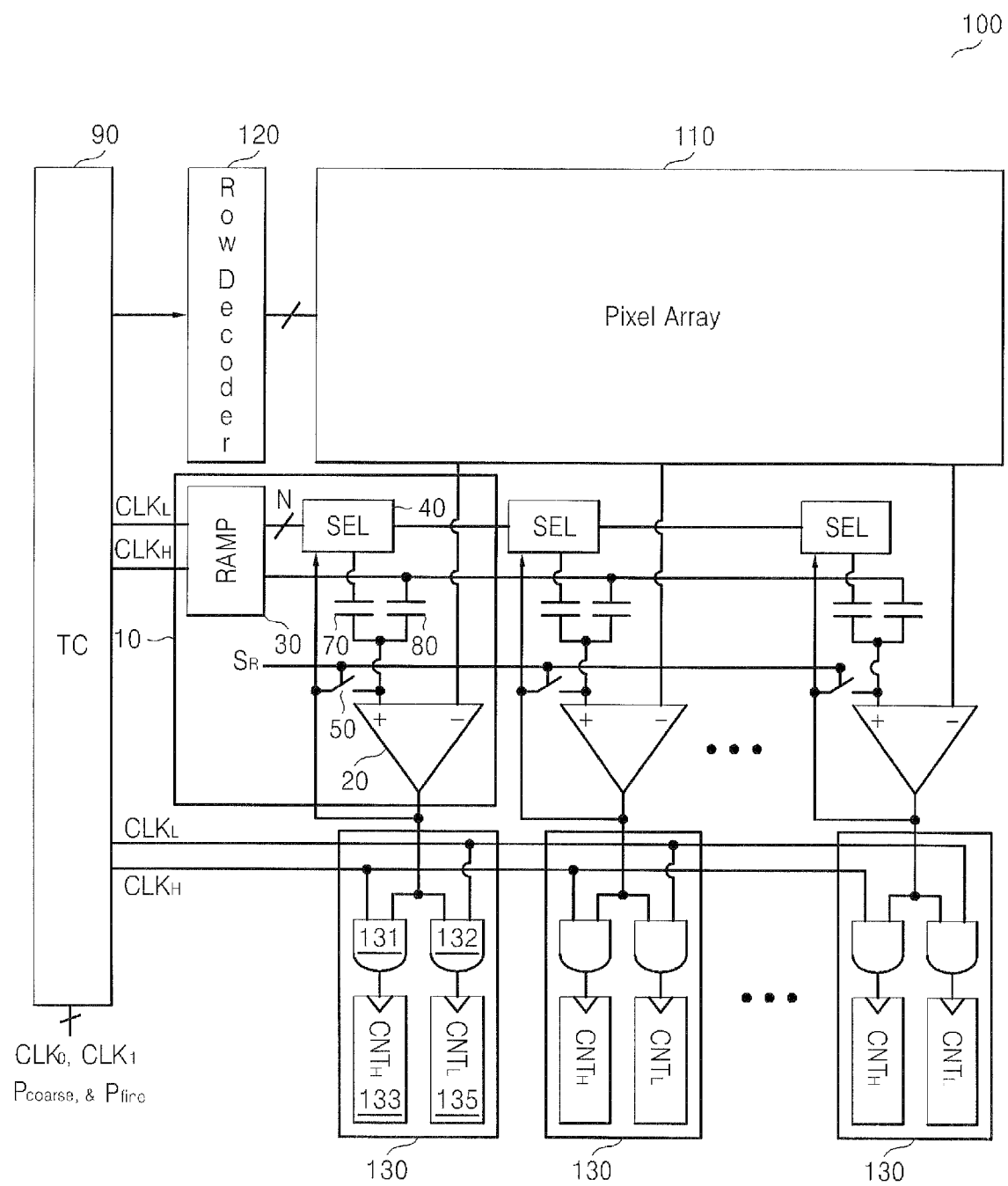
FIG. 1 is a block diagram of an image processing device according to an exemplary embodiment of the present inventive concept.
Figure 2:
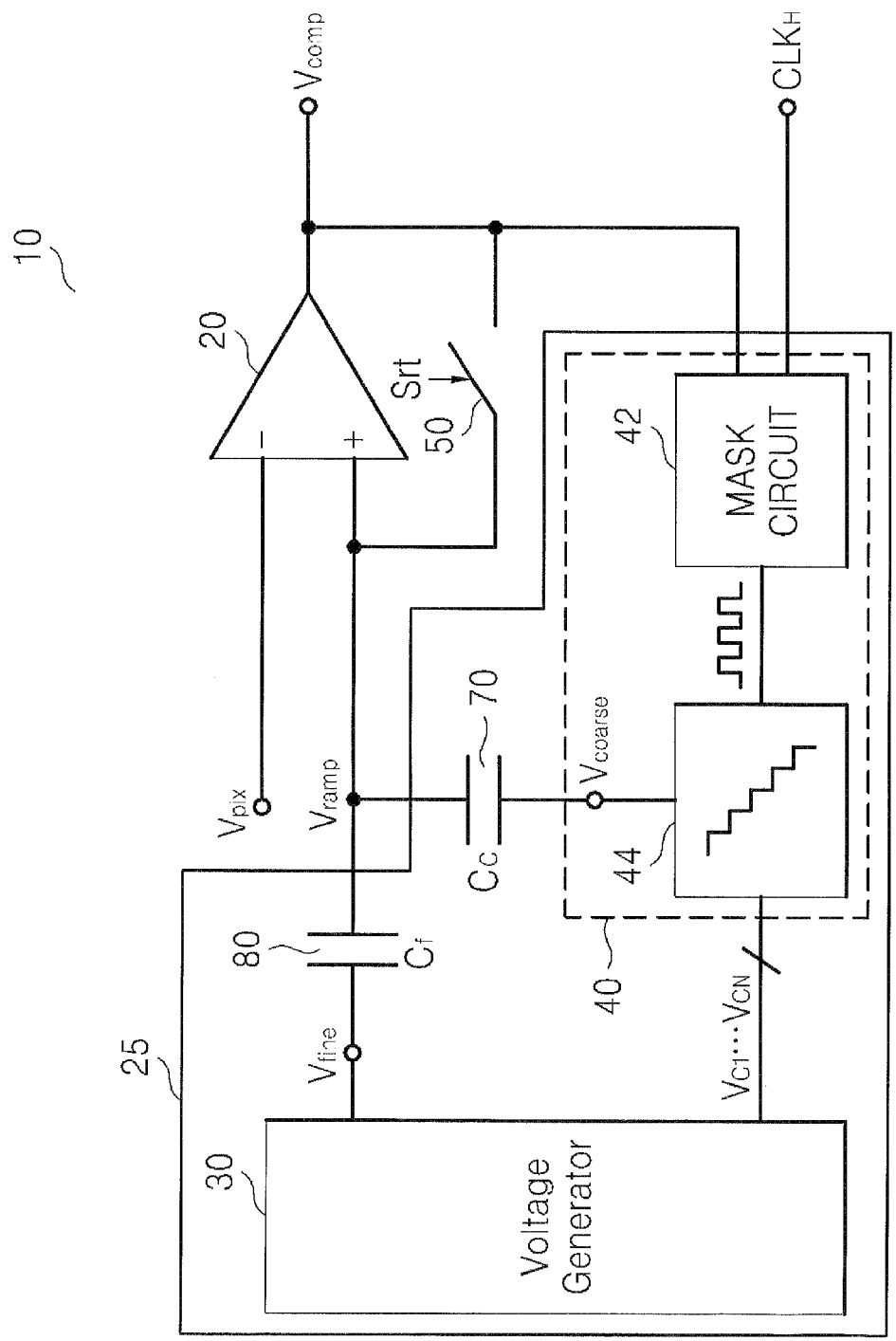
FIG. 2 is a circuit diagram of an analog-to-digital converter illustrated in FIG. 1, according to an exemplary embodiment of the inventive concept.

FIG. 1 is a block diagram of an image processing device 100 according to an exemplary embodiment of the present inventive concept. FIG. 2 is a circuit diagram of an analog-to-digital converter 10 illustrated in FIG. 1, according to an exemplary embodiment of the inventive concept. Referring to FIGS. 1 and 2, the image processing device 100 includes a timing controller 90, a pixel array 110, a row decoder 120, the analog-to-digital converter 10, and a plurality of counter blocks 130.

The timing controller 90 may generate at least one control signal for controlling the operation of at least one among the pixel array 110, the row decoder 120, the analog-to-digital converter 10, and the counter blocks 130. The row decoder 120 may select some pixels in a row from among a plurality of pixels included in the pixel array 110 in response to the at least one control signal output from the timing controller 90.

The analog-to-digital converter 10 includes a comparator 20, a reset switch 50, and a ramp signal supply circuit 25. As shown in FIG. 2, the analog-to-digital converter 10 includes a ramp signal generator 30 that functions as a voltage generator; however, in another exemplary embodiment of the present inventive concept, the analog-to-digital converter 10 may not include the ramp signal generator 30. In other words, the ramp signal generator 30 may be provided outside the analog-to-digital converter 10. In this configuration, the image processing device 100 may include a plurality of analog-to-digital converters and each analog-to-digital converter may include the comparator 20, the reset switch 50, a plurality of capacitors 70 and 80, and a voltage selection circuit 40.

A first input terminal, e.g., a negative (−) input terminal, of the comparator 20 receives a pixel signal $V_{pix}$ output from the pixel array 110 and a second input terminal, e.g., a positive (+) input terminal, of the comparator 20 receives a ramp signal $V_{ramp}$ output from the ramp signal supply circuit 25. At this time, the pixel signal $V_{pix}$ may include a reset signal and/or an image signal and the ramp signal $V_{ramp}$ may be a result of the superposition of a first signal $V_{coarse}$, e.g., a coarse ramp signal, and a second signal $V_{fine}$, e.g., a fine ramp signal.

The comparator 20 compares the pixel signal $V_{pix}$ with the ramp signal $V_{ramp}$ and outputs a comparison signal $V_{comp}$ according to the comparison result. The reset switch 50 may connect an output terminal of the comparator 20 with the second input terminal of the comparator 20 in response to a reset control signal Srt output from the timing controller 90 to reset the comparator 20.

The ramp signal supply circuit 25 includes the voltage generator 30, the voltage selection circuit 40, the first capacitor 70, and the second capacitor 80. The voltage generator 30 generates a plurality of voltages $V_{C1}$ through $V_{CN}$ and the second signal $V_{fine}$ and outputs the voltages $V_{C1}$ through $V_{CN}$ to the voltage selection circuit 40 and the second signal $V_{fine}$ to the second capacitor 80. The voltage selection circuit 40 includes a mask circuit 42 and a switch circuit 44.

During a first analog-to-digital conversion (ADC), e.g., a coarse ADC, the mask circuit 42 may provide a first clock signal $CLK_H$ or a direct current (DC) voltage, e.g., a ground voltage, to the switch circuit 44 in response to the first clock signal $CLK_H$ and the comparison signal $V_{comp}$. The mask circuit 42 may be implemented by an AND gate. During the first ADC, the switch circuit 44 may output one of the voltages $V_{C1}$ through $V_{CN}$ received from the voltage generator 30 as the first signal $V_{coarse}$, e.g., the coarse ramp signal, in response to the first clock signal $CLK_H$ output from the mask circuit 42.

The first capacitor 70 is connected between an output terminal of the switch circuit 44 and the second input terminal (+) of the comparator 20. The second capacitor 80 is connected between an output terminal of the voltage generator 30 outputting the second signal $V_{fine}$ and the second input terminal (+) of the comparator 20.

Accordingly, the ramp signal supply circuit 25 may generate the first signal $V_{coarse}$, e.g., the coarse ramp signal, and the second signal $V_{fine}$, e.g., the fine ramp signal, and provides the ramp signal $V_{ramp}$ corresponding to the superposition of the first signal $V_{coarse}$ and the second signal $V_{fine}$ to the second input terminal (+) of the comparator 20 using the first and second capacitors 70 and 80. The ramp signal supply circuit 25 changes the first signal $V_{coarse}$ during the first ADC, e.g., a coarse ADC illustrated in FIG. 6 and does not change the first signal $V_{coarse}$ during a second ADC, e.g., a fine ADC illustrated in FIG. 6.

When the reset switch 50 is turned on in response to the reset control signal Srt, the comparator 20 is initialized and the ramp signal $V_{ramp}$ has the same value as the pixel signal $V_{pix}$. Thereafter, when the reset switch 50 is turned off, the ramp signal $V_{ramp}$ has a value expressed by Equation (1):

$$V_{ramp} = V_{pix} + \frac{C_C * \Delta V_{coarse} + C_f * \Delta V_{fine}}{C_C + C_f}, \quad [1]$$

where $C_C$ is capacitance of the first capacitor 70, $C_f$ is capacitance of the second capacitor 80, $\Delta V_{coarse}$ is the amount of change in the first signal $V_{coarse}$, and the $\Delta V_{fine}$ is the amount of change in the second signal $V_{fine}$.

When the capacitance $C_C$ of the first capacitor 70 is the same as the capacitance $C_f$ of the second capacitor 80, Equation (1) can be rewritten as Equation (2):

$$V_{ramp} = V_{pix} + \frac{\Delta V_{coarse} + \Delta V_{fine}}{2}. \quad [2]$$

The image processing device 100 includes the counter blocks 130 each including a first block and a second block. The first block includes a first AND gate 131 and a first counter 133 and the second block includes a second AND gate 132 and a second counter 135.

During the first ADC, e.g., the coarse ADC, the first AND gate 131 may perform an AND operation on the comparison signal $V_{comp}$ and the first clock signal $CLK_H$ and output the first clock signal $CLK_H$ or the DC voltage, e.g. the ground voltage, to the first counter 133. The first counter 133 may output a first count value $CNT_H$ counted according to the first clock signal $CLK_H$. For instance, when the comparison signal $V_{comp}$ is at a high level, the first AND gate 131 outputs the first clock signal $CLK_H$, and therefore, the first counter 133 may count rising edges of the first clock signal $CLK_H$.

During the second ADC, e.g., the fine ADC, the second AND gate 132 may perform an AND operation on the comparison signal $V_{comp}$ and a second clock signal $CLK_L$ and output the second clock signal $CLK_L$ or the DC voltage, e.g. the ground voltage, to the second counter 135. The second counter 135 may output a second count value $CNT_L$ counted according to the second clock signal $CLK_L$. For instance, when the comparison signal $V_{comp}$ is at the high level, the second AND gate 132 outputs the second clock signal $CLK_L$, and therefore, the second counter 135 may count rising edges of the second clock signal $CLK_L$.

Figure 3:
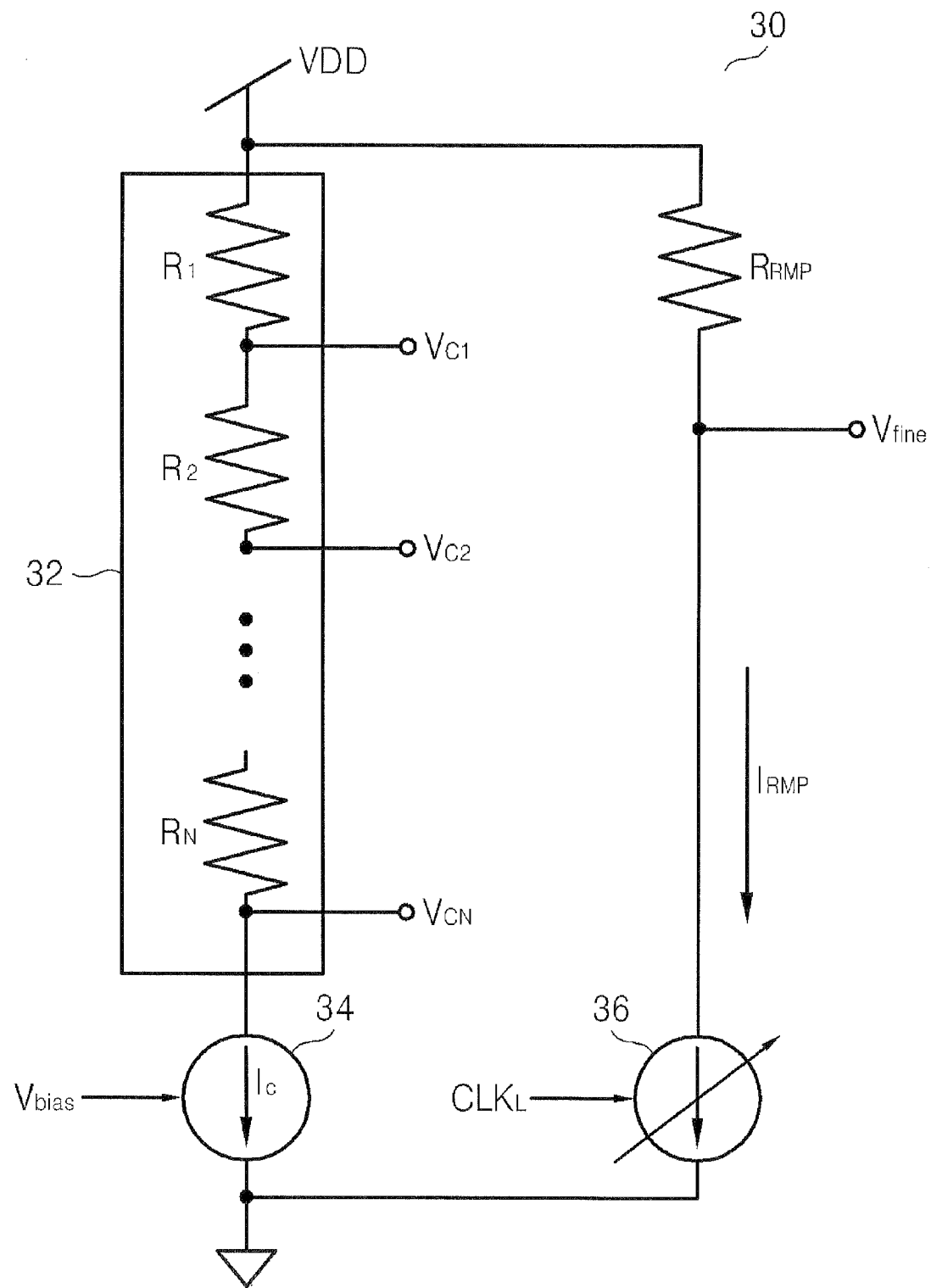
FIG. 3 is a circuit diagram of a voltage generator illustrated in FIG. 2, according to an exemplary embodiment of the inventive concept.
Figure 4A:
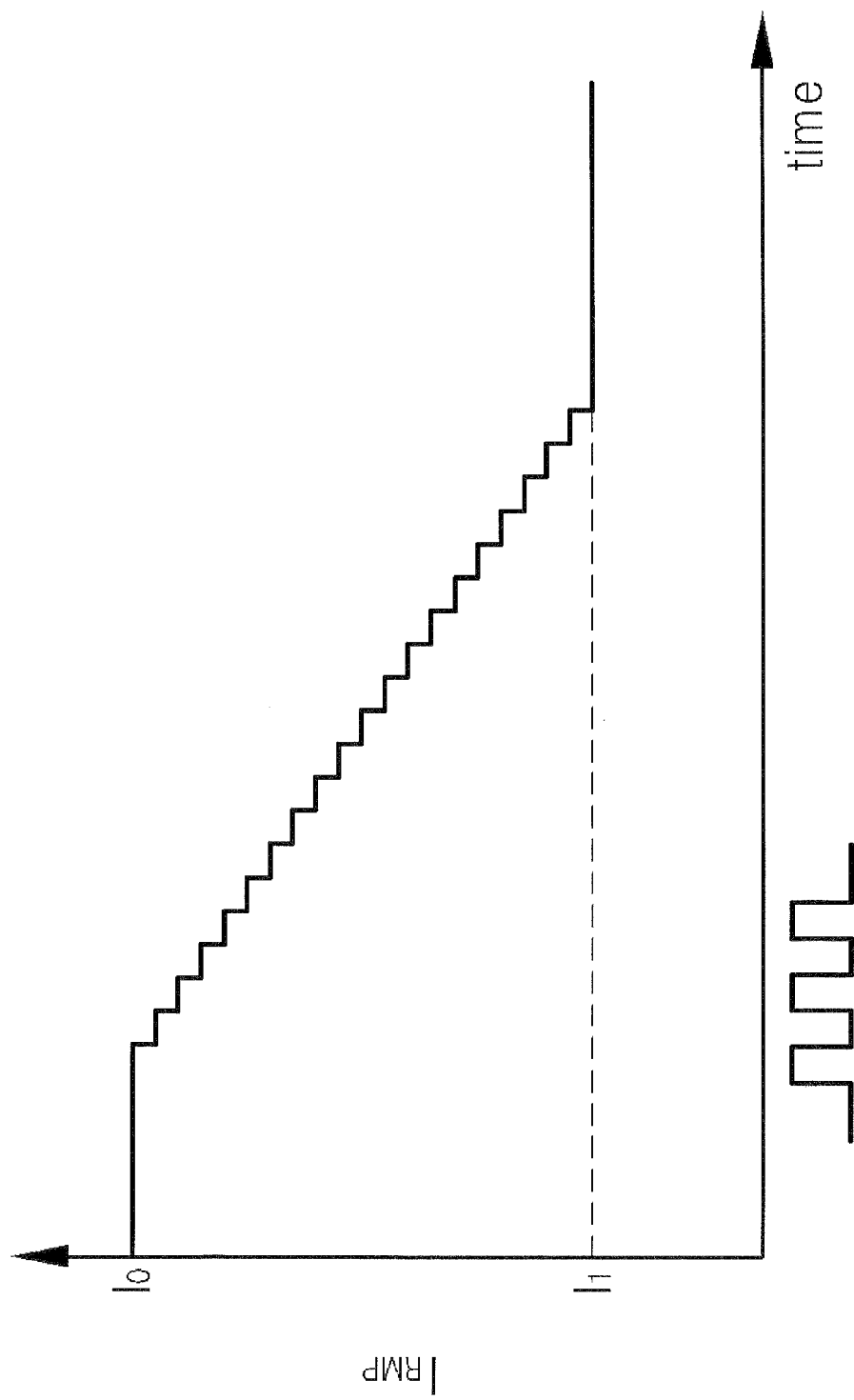
FIG. 4A shows a second current illustrated in FIG. 3 which sequentially decreases in response to a second clock signal, according to an exemplary embodiment of the inventive concept.
Figure 4B:
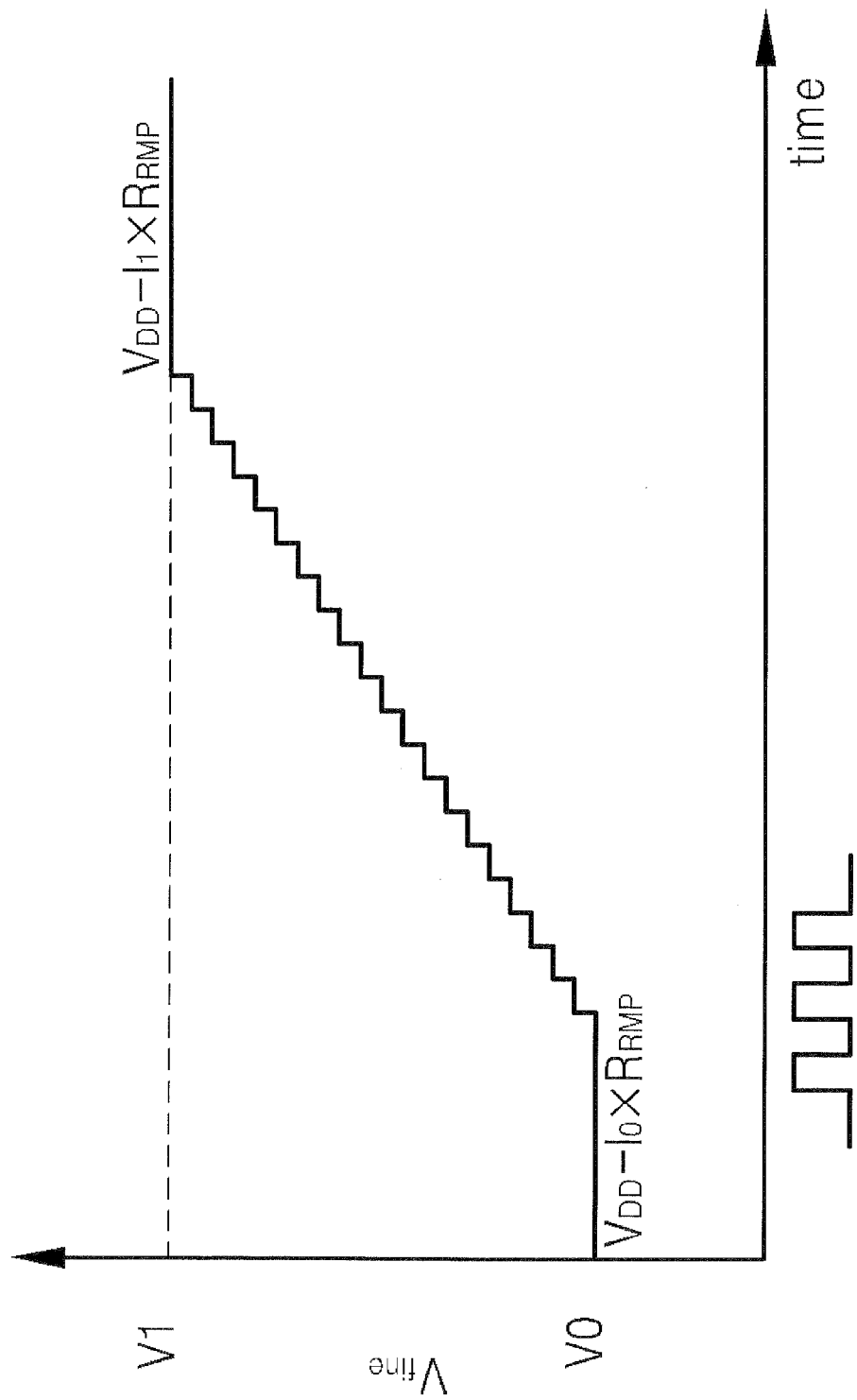
FIG. 4B shows a second signal which sequentially increases as the second current illustrated in FIG. 4A decreases, according to an exemplary embodiment of the inventive concept.

FIG. 3 is a circuit diagram of the voltage generator 30 illustrated in FIG. 2, according to an exemplary embodiment of the inventive concept. FIG. 4A shows a second current $I_{RMP}$ illustrated in FIG. 3 which sequentially decreases in response to the second clock signal $CLK_L$, according to an exemplary embodiment of the inventive concept. FIG. 4B shows the second signal $V_{fine}$ which sequentially increases as the second current $I_{Rim}$ illustrated in FIG. 4A decreases, according to an exemplary embodiment of the inventive concept.

Referring to FIGS. 1 through 4B, the voltage generator 30 includes a resistor string 32, a first current source 34, a resistor $R_{RMP}$, and a second current source 36. The resistor string 32 includes a plurality of resistors $R_1$ through $R_N$ and is connected between a power supply generating a power supply voltage VDD and the first current source 34. The first current source 34 is connected between the resistor string 32 and a ground and generates a first current $I_c$ in response to a bias voltage $V_{bias}$. The resistor string 32 and the first current source 34 evenly divide the power supply voltage VDD to generate the voltages $V_{C1}$ through $V_{CN}$. The resistors $R_1$ through $R_N$ may have the same resistance. The resistor $R_{RMP}$ is connected between the power supply generating the power supply voltage VDD and the output terminal of the voltage generator 30. The second current source 36 is connected between the resistor $R_{RMP}$ and the ground and generates the second current $I_{RMP}$.

Referring to FIG. 4A, the second current $I_{RMP}$ of the second current source 36 sequentially decreases, for example, from $I_0$ to $I_1$, in response to the second clock signal $CLK_L$ output from the timing controller 90. Referring to FIG. 4B, as the second current $I_{RMP}$ of the second current source 36 decreases, the second signal $V_{fine}$ sequentially increases, for example, from V0 to V1. In other words, the voltage generator 30 generates the voltages $V_{C1}$ through $V_{CN}$ and the second signal $V_{fine}$ at the same time.

Figure 5:
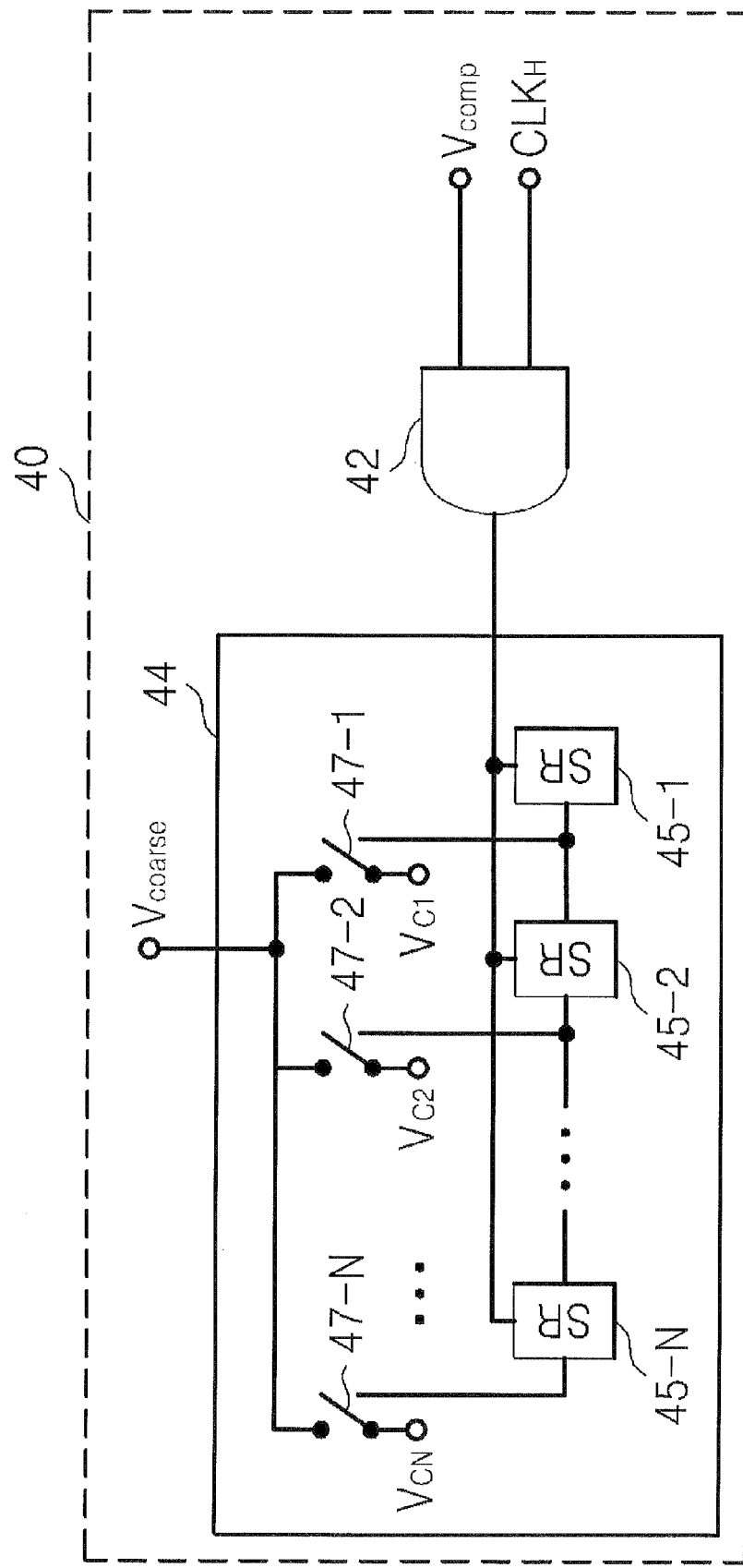
FIG. 5 is a circuit diagram of a voltage selection circuit illustrated in FIG. 2, according to an exemplary embodiment of the inventive concept.

FIG. 5 is a circuit diagram of the voltage selection circuit 40 illustrated in FIG. 2, according to an exemplary embodiment of the inventive concept. Referring to FIGS. 1 through 5, the voltage selection circuit 40 includes the mask circuit 42 and the switch circuit 44.

The mask circuit 42 outputs the first clock signal $CLK_H$ or the DC voltage, e.g., the ground voltage, in response to the first clock signal $CLK_H$ and the comparison signal $V_{comp}$. The mask circuit 42 may be implemented by an AND gate.

The switch circuit 44 includes a plurality of shift registers 45-1 through 45-N and a plurality of switches 47-1 through 47-N. The shift registers 45-1 through 45-N sequentially shift their initial bits in response to the first clock signal $CLK_H$ received from the mask circuit 42. The operation of the shift registers 45-1 through 45-N may be controlled by the level of the comparison signal $V_{comp}$. For instance, when the comparison signal $V_{comp}$ is at the high level, the initial bits of the shift registers 45-1 through 45-N may be shifted in response to the first clock signal $CLK_H$, and when the comparison signal $V_{comp}$ is at a low level, the bits of the shift registers 45-1 through 45-N may be held. The initial bit of the first shift register 45-1 may be set to "1" and the initial bits of the other shift registers 45-2 through 45-N may be set to "0".

Figure 6:
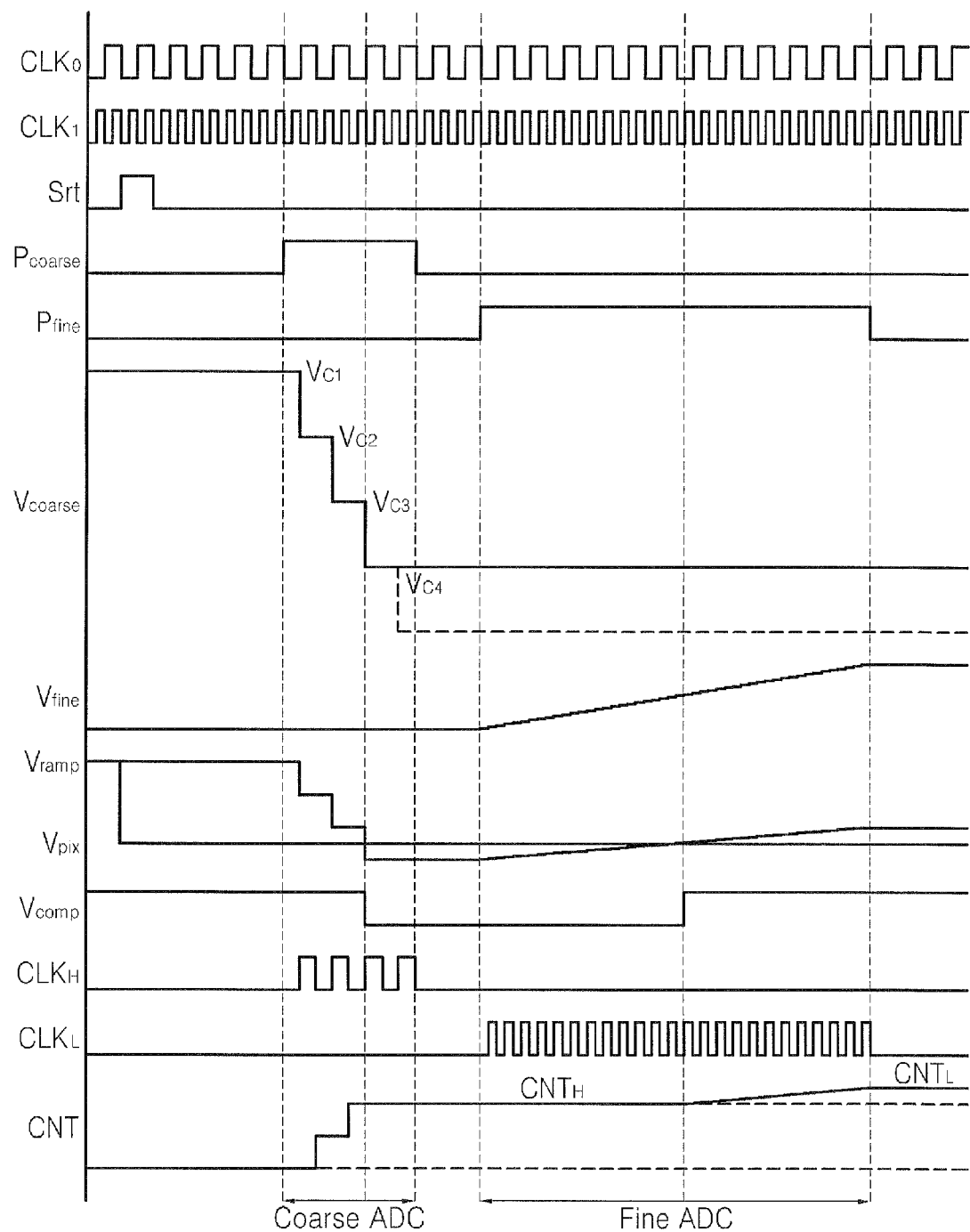
FIG. 6 is a timing chart of the operation of the image processing device illustrated in FIG. 1, according to an exemplary embodiment of the inventive concept.

The switches 47-1 through 47-N may sequentially provide the voltages $V_{C1}$ through $V_{CN}$, respectively, to the second input terminal of the comparator 20 in response to the initial bits, respectively, of the shift registers 45-1 through 45-N, as illustrated in FIG. 6. For instance, the first switch 47-1 outputs the voltage $V_{C1}$ as the first signal $V_{coarse}$ in response to the initial bit, e.g., "1" output from the first shift register 45-1. As the initial bit of "1" of the first shift register 45-1 is shifted to the second shift register 45-2, the first switch 47-1 is turned off and the second switch 47-2 outputs the voltage $V_{C2}$ as the first signal $V_{coarse}$ in response to the bit of "1" output from the second shift register 45-2.

FIG. 6 is a timing chart of the operation of the image processing device 100 illustrated in FIG. 1, according to an exemplary embodiment of the inventive concept. Referring to FIGS. 1 through 6, the timing controller 90 outputs the first clock signal $CLK_H$ based on a first frequency clock signal $CLK_0$ when a first enable signal $P_{coarse}$ is activated. Thereafter, the first ADC, e.g., the coarse ADC starts and the voltage selection circuit 40 sequentially outputs the voltages $V_{C1}$ through $V_{C4}$, which sequentially decrease, as the first signal $V_{coarse}$ until the comparison signal $V_{comp}$ transits from the high level to the low level and then maintains the voltage $V_{C4}$, which is output when the comparison signal $V_{comp}$ transits from the high level to the low level, as the first signal $V_{coarse}$.

When a second enable signal $P_{fine}$ is activated, the timing controller 90 outputs the second clock signal $CLK_L$ based on a second frequency clock signal $CLK_1$. Thereafter, the second ADC, e.g., the fine ADC starts and the voltage generator 30 outputs the second signal $V_{fine}$ sequentially increasing as a fine ramp signal in response to the second clock signal $CLK_L$.

The second frequency clock signal $CLK_1$ may have a higher frequency than the first frequency clock signal $CLK_0$. For instance, when a 10-bit 2-step single slope ADC having three upper bits and seven lower bits is embodied in a 2-step single slope ADC in which an ADC is performed in steps, e.g., a coarse ramping step and a fine ramping step, the frequency of the second clock signal $CLK_L$ may be set to 200 MHz and the frequency of the first clock signal $CLK_H$ may be set to 25 (=200/23) MHz so that the second signal $V_{fine}$ is changed as much as 256-LSB while the first signal $V_{coarse}$ is changed as much as 1-LSB.

During the first ADC, e.g., the coarse ADC, the first clock signal $CLK_H$ is input to the mask circuit 42 and the first AND gate 131. The mask circuit 42 outputs the first clock signal $CLK_H$ when the comparison signal $V_{comp}$ is at the high level.

While the first clock signal $CLK_H$ is being provided to the switch circuit 44, in other words, during the first ADC, e.g., the coarse ADC, the first signal $V_{coarse}$ sequentially decreases from the first level $V_{C1}$ to the fourth level $V_{C4}$. Accordingly, the ramp signal $V_{ramp}$, e.g., the first signal $V_{coarse}$, sequentially decreases and when the first signal $V_{coarse}$ transits to the fourth level $V_{C4}$ (or when the ramp signal $V_{ramp}$ becomes lower than the pixel signal $V_{pix}$), the comparison signal $V_{comp}$ transits from the high level to the low level.

When the comparison signal $V_{comp}$ transits from the high level to the low level, an output signal of the mask circuit 42 is at a low level. Accordingly, the first signal $V_{coarse}$ does not decrease any more and is maintained at the fourth level $V_{C4}$ by the first capacitor 70. While the comparison signal $V_{comp}$ is at the high level and the first clock signal $CLK_H$ is provided to the counter block 130, the first counter 133 counts the first clock signal $CLK_H$ and outputs the first count value $CNT_H$. Thereafter, when the comparison signal $V_{comp}$ transits to the low level, the first counter 133 maintains the first count value $CNT_H$ obtained at that moment or just before the comparison signal $V_{comp}$ transits to the low level.

During the second ADC, e.g., the fine ADC, the second clock signal $CLK_L$ is input to the second current source 36 of the voltage generator 30 and the second AND gate 132 of the counter block 130. The second current $I_{RMP}$ flowing in the second current source 36 sequentially decreases in response to the second clock signal $CLK_L$, as illustrated in FIG. 4A. Accordingly, during the second ADC while the second clock signal $CLK_L$ is being provided to the second current source 36, the second signal $V_{fine}$ sequentially increases.

When the second signal $V_{fine}$ sequentially increases as illustrated in FIG. 4B, the ramp signal $V_{ramp}$ also sequentially increases and when the ramp signal $V_{ramp}$ becomes higher than the pixel signal $V_{pix}$, the comparison signal $V_{comp}$ transits from the low level to the high level.

Figure 7:
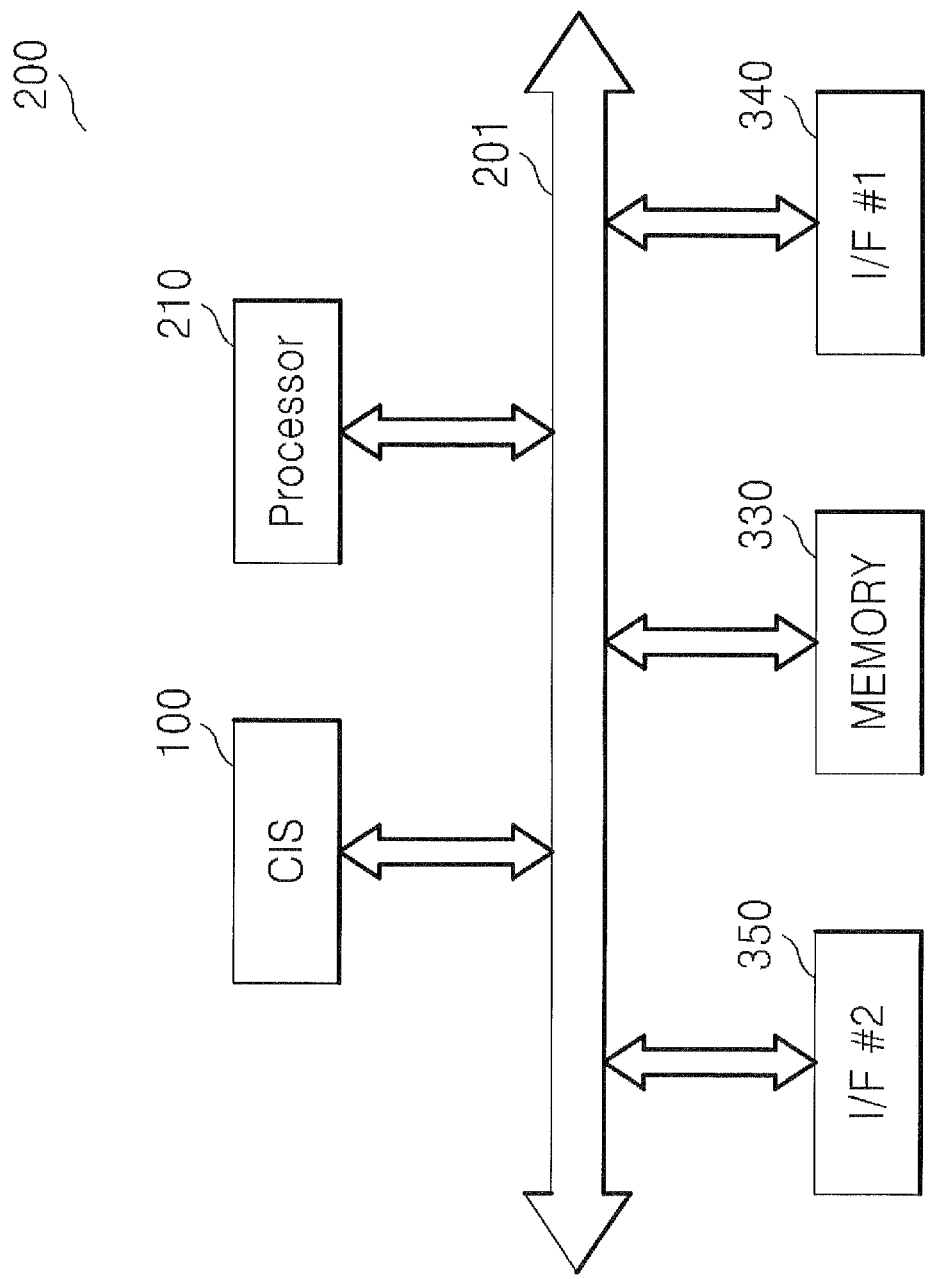
FIG. 7 is a block diagram of an image processing system including the image processing device illustrated in FIG. 1, according to an exemplary embodiment of the inventive concept.

FIG. 7 is a block diagram of an image processing system 200 including the image processing device 100 illustrated in FIG. 1, according to an exemplary embodiment of the inventive concept. The image processing system 200 may be a digital camera, a portable device having a built-in digital camera such as a mobile phone, a smart phone, a personal digital assistant (PDA), or a portable multimedia player (PMP), or an information technology (IT) device equipped with a digital camera.

Referring to FIG. 7, the image processing system 200 includes the image processing device or an image sensor 100 and a processor 210 controlling the image sensor 100. The image sensor 100 may be implemented by a complementary metal-oxide-semiconductor (CMOS) image sensor (CIS).

When the image sensor 100 includes an image signal processor (not shown), the processor 210 may be implemented by a central processing unit that can process an image signal that has been processed by the image signal processor. When the image sensor 100 does not include the image signal processor, the processor 210 may be an image signal processor that can process an image signal output from the image sensor 100.

The image processing system 200 may also include a memory device 330 which stores an image signal or data processed by the processor 210. The memory device 330 may be implemented by a non-volatile memory device such as electrically erasable programmable read-only memory (EEPROM), flash memory, phase-change random access memory (PRAM), magnetoresistive RAM (MRAM), or resistive RAM (ReRAM).

The image processing system 200 may also include an input/output interface 340 which outputs an image signal processed by the processor 210 to an outside of the system 200 and transmits an external input signal to the processor 210. In addition, the image processing system 200 may include a wireless interface 350 which outputs an image signal processed by the processor 210 to the outside via a wireless connection and transmits an input signal received from the outside via the wireless connection to the processor 210. The elements 100, 210, 330, 340, and 350 of the image processing system 200 are connected to one another though a bus 201.

According to an exemplary embodiment of the present inventive concept, an analog-to-digital converter generates a ramp signal by superposing a coarse ramp signal and a fine ramp signal using a plurality of capacitors, thereby compensating for when the gain of a coarse ramping stage is not the same as the gain of a fine ramping stage.

While the present inventive concept has been particularly shown and described with reference to exemplary embodiments thereof, it will be understood by those of ordinary skill in the art that various changes in form and detail may be made thereto without departing from the spirit and scope of the present inventive concept as defined by the following claims.

What is claimed is:

1. An analog-to-digital converter, comprising:
a comparator configured to compare a pixel signal received at a first input terminal thereof with a ramp signal received at a second input terminal thereof and generate a comparison signal as a result of the comparison; and
a ramp signal supply circuit configured to provide the ramp signal to the comparator,
wherein the ramp signal supply circuit generates a first signal as part of the ramp signal in response to the comparison signal and a first clock signal being received at the ramp signal supply circuit, wherein a value of the first signal sequentially changes until the comparison signal makes a transition from one logic level to another and,
after the transition, the ramp signal supply circuit generates a second signal as part of the ramp signal, wherein a value of the second signal sequentially changes, wherein a slope of the second signal is opposite a slope of the first signal,
wherein the first signal is provided to the second input terminal via a first capacitor in the ramp signal supply circuit and the second signal is provided to the second input terminal via a second capacitor in the ramp signal supply circuit,
wherein the ramp signal supply circuit provides the ramp signal corresponding to a superposition of the first signal and the second signal to the second input terminal of the comparator using the first and second capacitors.

2. The analog-to-digital converter of claim 1, wherein the first capacitor and the second capacitor have the same capacitance.

3. The analog-to-digital converter of claim 1, wherein a voltage of the second signal sequentially increases in response to a second clock signal having a frequency higher than a frequency of the first clock signal.

4. The analog-to-digital converter of claim 1, wherein the ramp signal supply circuit comprises:
a resistor string configured to divide a power supply voltage to generate a plurality of voltages;
a first current source connected between the resistor string and a ground;
a resistor connected between a power supply supplying the power supply voltage and an output terminal from which the second signal is output; and
a second current source connected between the resistor and the ground.

5. The analog-to-digital converter of claim 4, wherein as a current of the second current source sequentially decreases in response to a second clock signal, the value of the second signal sequentially increases.

6. The analog-to-digital converter of claim 4, wherein the ramp signal supply circuit further comprises:
a mask circuit configured to output the first clock signal or a direct current (DC) voltage in response to the comparison signal and the first clock signal being received at the mask; and
a switch circuit configured to sequentially change the plurality of voltages in response to the first clock signal received from the mask circuit and output the sequentially changed voltages as the first signal.

7. The analog-to-digital converter of claim 5, wherein the switch circuit comprises:
a plurality of shift registers connected in series to each other to sequentially shift their initial bits in response to the first clock signal; and
a plurality of switches configured to sequentially provide the plurality of voltages to the second input terminal in response to the initial bits, respectively, of the shift registers.

8. The analog-to-digital converter of claim 4, wherein differences between adjacent voltages among the plurality of voltages are the same.

9. An image processing device, comprising:
a pixel array configured to output a pixel signal; and
an analog-to-digital converter, wherein the analog-to-digital converter includes a comparator and a ramp signal supply circuit, the comparator is configured to compare the pixel signal received from the pixel array at a first input terminal of the comparator and a ramp signal received at a second input terminal of the comparator and generate a comparison signal as a result of the comparison, the ramp signal supply circuit is configured to provide the ramp signal to the comparator,
wherein the ramp signal supply circuit generates a first signal as part of the ramp signal in response to the comparison signal and a first clock signal being received at the ramp signal supply circuit, wherein a value of the first signal sequentially changes until the comparison signal makes a transition from one logic level to another and,
after the transition, the ramp signal supply circuit generates a second signal as part of the ramp signal, wherein a value of the second signal sequentially changes, wherein a slope of the second signal is opposite a slope of the first signal,
wherein the first signal is provided via a first capacitor connected to the second input terminal and the second signal is provided via a second capacitor connected to the second input terminal,
wherein the ramp signal supply circuit provides the ramp signal corresponding to a superposition of the first signal and the second signal to the second input terminal of the comparator using the first and second capacitors.

10. The image processing device of claim 9, wherein a voltage of the second signal sequentially increases in response to a second clock signal having a frequency higher than a frequency of the first clock signal.

11. The image processing device of claim 10, wherein a voltage of the first signal sequentially decreases before the voltage of the second signal is sequentially increased.

12. The image processing device of claim 9, further comprising:
- a resistor string configured to evenly divide a power supply voltage to generate a plurality of voltages;
- a first current source connected between the resistor string and a ground;
- a resistor connected between a power supply supplying the power supply voltage and an output terminal from which the second signal is output; and
- a second current source connected between the resistor and the ground.

13. The image processing device of claim 12, wherein as a current of the second current source sequentially decreases in response to a second clock signal, the value of the second signal sequentially increases.

14. The image processing device of claim 12, wherein the analog-to-digital converter further comprises:
- a mask circuit configured to output the first clock signal or a direct current (DC) voltage in response to the comparison signal and the first clock signal being received at the mask; and
- a switch circuit configured to sequentially change the plurality of voltages in response to the first clock signal received from the mask circuit and output the sequentially changed voltages as the first signal.

15. The image processing device of claim 9, further comprising a processor configured to control an operation of the image processing device.

16. An analog-to-digital converter, comprising:
- a comparator configured to compare a pixel signal received at a first input terminal thereof with a ramp signal received at a second input terminal thereof and generate a comparison signal as a result of the comparison; and
- a ramp signal supply circuit configured to provide the ramp signal to the comparator,
- wherein the ramp signal is a superposition of a fine signal and a coarse signal generated by the ramp signal supply circuit during a coarse analog-to-digital conversion and a fine analog-to-digital conversion,
- wherein during the coarse analog-to-digital conversion, a voltage level of the coarse signal sequentially decreases and a voltage level of the fine signal is steady, wherein the voltage level of the coarse signal sequentially decreases until a logic level of the comparison signal is first changed, and then, the voltage level of the coarse signal is steady, and
- wherein during the fine analog-to-digital conversion, the voltage level of the coarse signal is steady and the voltage level of the fine signal increases,
- wherein the ramp signal supply circuit comprises:
- a resistor string configured to divide a power supply voltage to generate a plurality of voltages;
- a first current source connected between the resistor string and a ground;
- a resistor connected between a power supply supplying the power supply voltage and an output terminal from which the fine signal is output; and
- a second current source connected between the resistor and the ground.

17. The analog-to-digital converter of claim 16, wherein the fine signal is kept steady by a first capacitor of the ramp signal supply circuit and the coarse signal is kept steady by a second capacitor of the ramp signal supply circuit.

18. The analog-to-digital converter of claim 16, wherein the logic level of the comparison signal is first changed in the coarse analog-to-digital conversion when a voltage level of the ramp signal is less than a voltage level of the pixel signal and the logic level of the comparison signal is second changed in the fine analog-to-digital conversion when the voltage level of the ramp signal is greater than the voltage level of the pixel signal.

* * * * *